United States Patent [19]

Ito et al.

[11] Patent Number: 5,204,315
[45] Date of Patent: Apr. 20, 1993

[54] SUPERCONDUCTOR WIRE AND PROCESS FOR PRODUCTION THEREOF

[75] Inventors: Yoshitaka Ito, Kariya; Masami Ishii, Toyota; Tetsuo Oka, Obu; Takeo Nakagawa; Lihong Zhang, both of Kawasaki, all of Japan

[73] Assignee: Aisin Seiki Kabushiki Kaisha, Kariya, Japan

[21] Appl. No.: 837,918

[22] Filed: Feb. 20, 1992

[30] Foreign Application Priority Data

Feb. 27, 1991 [JP] Japan ................. 3-55901

[51] Int. Cl.$^5$ .................. H01B 12/00; B22F 1/00
[52] U.S. Cl. .................. 505/1; 505/740; 419/3; 419/38; 419/41
[58] Field of Search ............ 419/41, 3, 38; 505/1, 505/740

[56] References Cited

U.S. PATENT DOCUMENTS

| | | | |
|---|---|---|---|
| 2,134,752 | 11/1938 | Ehlers | 419/38 |
| 3,678,567 | 7/1972 | Manilla et al. | 29/420.5 |
| 4,687,883 | 8/1987 | Flükiger et al. | 174/126 S |
| 4,965,249 | 10/1990 | De With et al. | 505/1 |
| 4,992,238 | 2/1991 | Couper et al. | 419/41 |
| 5,037,801 | 8/1991 | Kloucek | 505/1 |
| 5,075,285 | 12/1991 | Flükiger | 505/1 |
| 5,100,867 | 3/1992 | Gunzelmann et al. | 505/1 |
| 5,106,825 | 4/1992 | Mandigo et al. | 505/1 |

OTHER PUBLICATIONS

Bulletin of the Japan Institute of Metals, vo. 34, No. 10, pp. 980–984 (1987).
Journal of the Japan Society of Powder and Powder Metallurgy, vol. 34, No. 10, pp. 117–118 (Dec. 1987).

*Primary Examiner*—Donald P. Walsh
*Assistant Examiner*—Daniel Jenkins
*Attorney, Agent, or Firm*—Burns, Doane, Swecker & Mathis

[57] ABSTRACT

A process for production of superconductor wire having multiple rings, comprising the steps of: preparing a silver mixture comprising a silver or silver-gold alloy mixed with a bonding agent, and a superconductor mixture comprising a superconductor powder with bonding agent; arranging both the silver mixture and the superconductor mixture in a extrusion die; extruding a wire having at least one ring of the superconductor mixture and one ring of the silver mixture in the radial direction; and heating the wire at the sinter temperature of the oxide superconductor so that the bonding agent is removed and the oxide superconductor powder and the silver powder are sintered. A superconductor wire comprising an inner core and an outer ring covering the core, wherein one of the ring on the core comprises a sintered silver powder and the other of the ring on the core comprises a sintered oxide superconductor powder.

3 Claims, 6 Drawing Sheets

A →

B →

C →

SUPERCONDUCTOR WIRE AND PROCESS FOR PRODUCTION THEREOF

FIELD OF THE INVENTION

The present invention relates to a superconductor wire which has high mechanical strength and a process for production thereof.

BACKGROUND OF INVENTION

A superconductor wire is used in the energy field, such as power generation, power transmission and power supply, or in the field of traffic transport, such as a train raised above a surface by the magnetic effect (linear motor car), or in other fields.

Recently oxide superconductors which operate at temperature higher than the temperature of liquid nitrogen (77K) have been invented, and the possible fields in which the superconductors may be applied are expanding rapidly. The development of superconducting wire technology is required in order to place the superconductor technology into practical use.

A well-known conventional wire making process for production of superconductor wire as follows; on organic bonding agent and a superconductor oxide powder are mixed, then the mixture is placed in a metal pipe composed of Cu-Ni or Ag, and the mixture is formed into a wire by swaging etc. The pipe is then removed, and the product is heat-treated (BULLETIN OF THE JAPAN INSTITUTE OF METALS, VOL. 26 NO. 10 1987, page 980). According to this process, in the heat treatment process, the bonding agent is vaporized, and at the same time the superconductor oxide powder is sintered with large volume shrinkage to provide the sintered wire.

Additionally, another process is as follows; the superconductor oxide powder is pressed into a copper container by about 500 kg/cm$^2$ pressure, is pre-heated for about 5 minutes in an electric furnace, and is then immediately put into an anti-pressure container and extruded by a press (JOURNAL OF THE JAPAN SOCIETY OF POWDER AND POWDER METALLURGY, VOL. 34 NO. 10, Dec. 1987, page 117). According to this process, after the extrusion, a heat-treatment is carried out in order to obtain the superconductor property.

However, the sintered wire produced by the first process composed of only the superconductor oxide powder is very brittle and is cracked by external force and impact.

On the other hand, in second process, the circumference of the wire is covered with metal, so that the superconductor has good mechanical strength, but the production requires several separate extrusion steps. Namely, several extrusion steps are required because of the flow property of the superconductor oxide powder at high temperature. It is not possible to enlarge the squeezing ratio of the copper container filled with the superconductor powder. Additionally, at high temperature the amount of extrusion of the copper container filled with the oxide superconductor is limited, so that a long wire cannot be produced.

SUMMARY OF INVENTION

It is an object of the present invention to provide a long superconductor wire which has the superior mechanical strength. It is also an object of the present invention to provide a process for easy production of such a wire.

In carrying out the present invention in one preferred mode, we utilize a process for production of superconductor wire having multiple rings, comprising the steps of: preparing a silver mixture comprising a silver or silver-gold alloy mixed with a bonding agent, and a superconductor mixture comprising a superconductor powder with bonding agent; arranging both the silver mixture and the superconductor mixture in a extrusion die; extruding a wire having at least one ring of the superconductor mixture and one ring of the silver mixture in the radial direction; and heating the wire at the sinter temperature of the oxide superconductor so that the bonding agent is removed and the oxide superconductor powder and the silver powder are sintered.

A superconductor wire comprising an inner core and an outer ring covering the core, wherein one of the ring on the core comprises a sintered silver powder and the other of the ring on the core comprises a sintered oxide superconductor powder.

DETAILED DESCRIPTION OF THE INVENTION

Either a silver powder or a silver-gold alloy powder may be used for as above-mentioned powder. The powder is mixed with a bonding agent to provide the silver mixture.

A resin such as acrylic-epoxy resin, A wax, or water mixed with an organic binder may be used for the bonding agent. Furthermore, a plasticizer or a dispersing agent may be mixed with the bonding agent in order to control the viscosity as required. The bonding agent allows the silver mixture to solidify, but also allows the silver mixture to flow easily when it is extruded. The silver mixture is then formed in the shape of a column or a cylinder.

Such as $Y_1Ba_2Cu_3O_x$ (hereinafter referred YBCO), BiSrCaCuO materials etc. are used as the oxide superconductor powder. YBCO with x being 6.5~7.0 has a superior superconductive property.

The oxide superconductor powder is mixed with the bonding agent to provide a superconductor mixture. This bonding agent is the same as the above-mentioned bonding agent. The superconductor mixture is formed in the shape of a column or a cylinder. Furthermore, the average particle diameter of the silver powder and the oxide superconductor are preferably not more than 10

μm. This allows a fluid property during the extrusion process.

Figure 5:
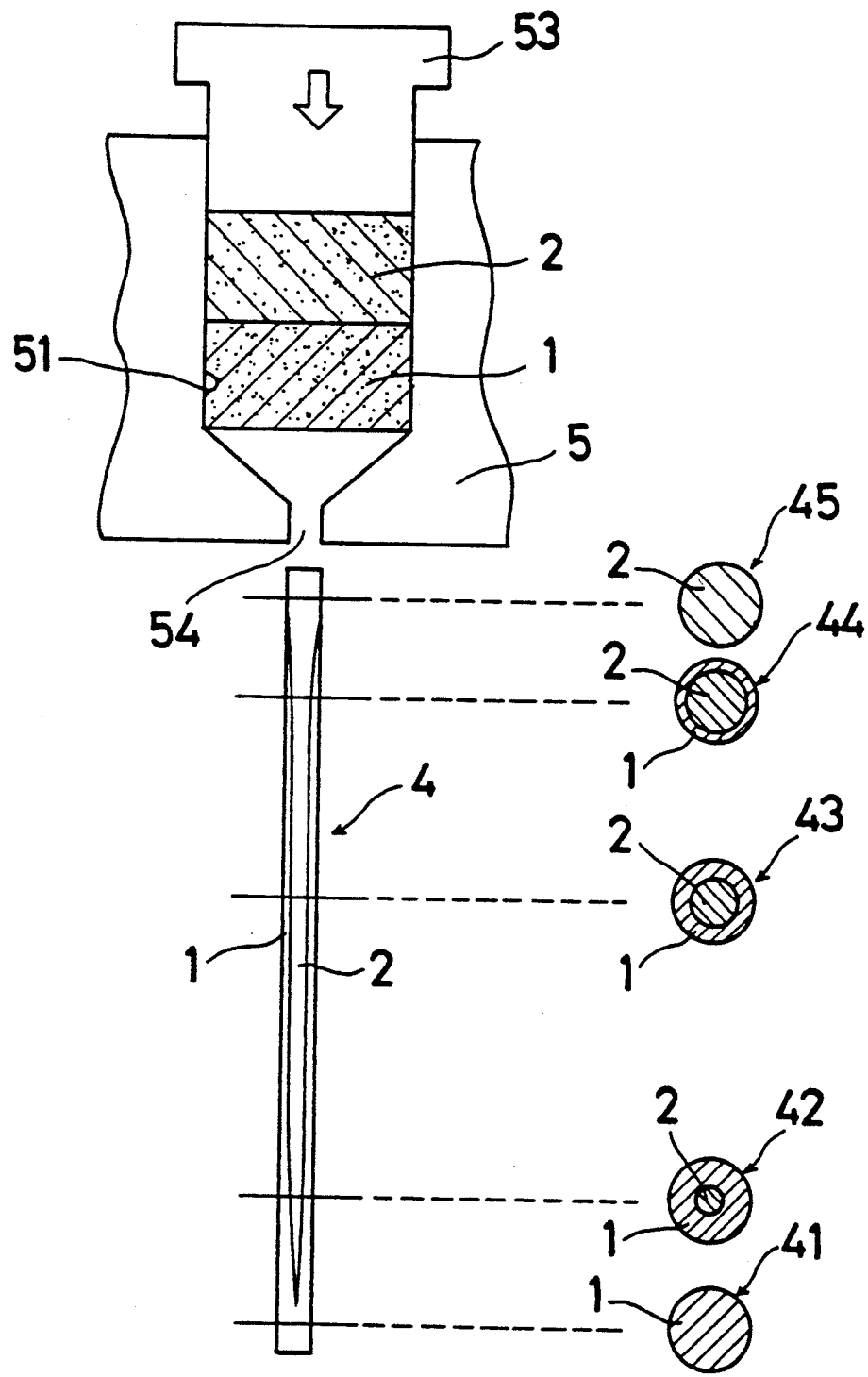
FIG. 5 shows a cross sectional view of the method of producing the wire in Example 2.

For extrusion, the silver mixture and superconductor mixture are arranged in a die. The columnar superconductor may be inserted into the cylindrical silver mixture (FIG. 1), the columnar superconductor may be laid on top of the columnar silver mixture (FIG. 5).

Figure 8:
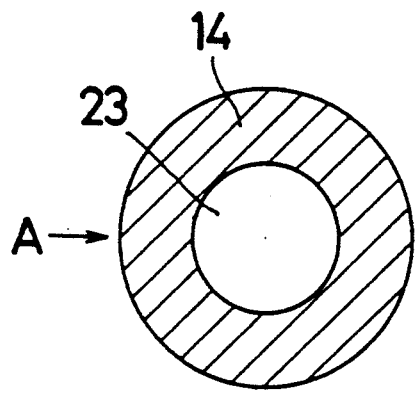
FIG. 8 A-F shows transverse cross sectional views of several embodiments of the superconductor wire having multiple rings.
Figure 8:
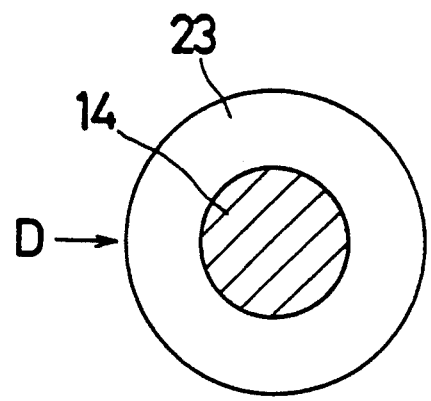
Figure 8:
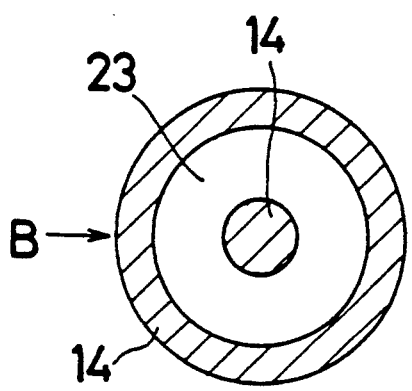
Figure 8:
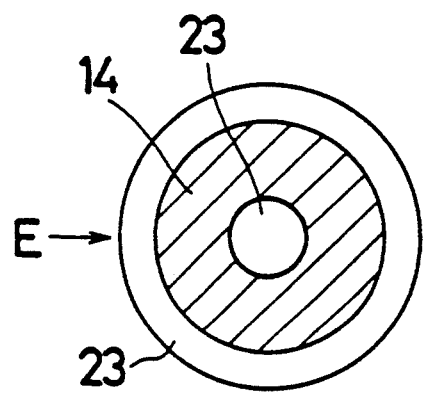
Figure 8:
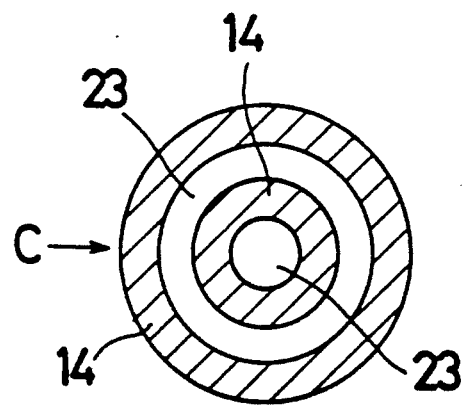
Figure 8:
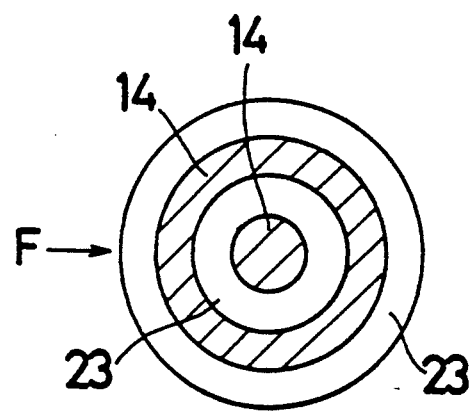

The silver mixture and the superconductor arranged as described above are extruded at a surface pressure of 500~1000 kg/cm$^2$ through a hole having a diameter of 0.7~2 mm. The silver mixture and the superconductor mixture form a wire having a superior fluid property because of the presence of the bonding agent. As a result of this, a wire having multiple rings in the radial direction of its cross section is formed. That is, the silver mixture and the superconductor mixture are extruded coaxially. This wire will have no less two rings, as shown in FIG. 8.

Next, the wire is heated at a temperature of about 800~1000° C., which is the sinter temperature of the oxide superconductor. As a result of this, the bonding agent is vaporized and removed. Both the oxide superconductor powder and the silver powder are sintered. Accordingly a superconductor wire composed of multiple rings is produced.

Figure 4:
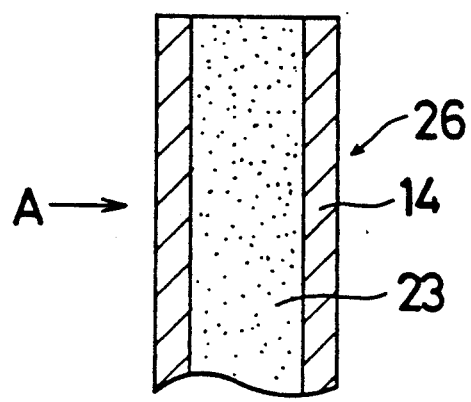
FIG. 4 A-C shows several embodiments of the superconductor wire.
Figure 4:
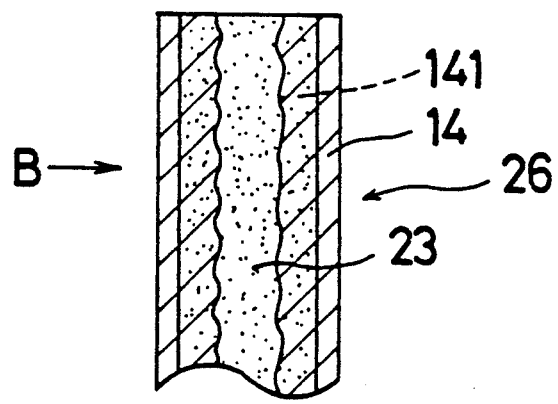
Figure 4:
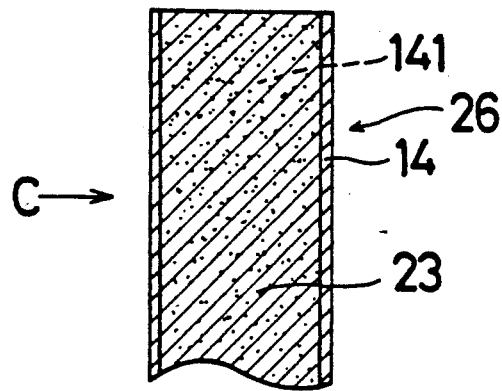

Furthermore, when the sinter time is longer or the sinter temperature is higher, a portion of the silver powder penetrates into the sintered layer of the oxide superconductor as shown in FIG. 4 so that the superconductor wire has superior mechanical strength.

The superconductor wire produced by the above-mentioned process is a one piece wire with the oxide superconductor powder layer inside the sintered silver powder layer. The sintered silver powder layer is made from the silver powder composed of silver or silver-gold alloy. The superconductor layer is made from the oxide superconductor powder. Additionally, the superconductor wire has multiple rings laid alternately in the diameter direction of its cross section.

In the process of production of the present invention, the silver mixture and the superconductor mixture are formed separately, inserted into the extrusion die, and are extruded at the ordinary temperature. In the process, the bonding agent is mixed with the silver mixture and the superconductor mixture. Therefore both mixtures flow easily. Accordingly, both mixtures move smoothly and uniformly to the extrusion hole of the extrusion die, and are extruded. Therefore a multiple cylindrical superconductor wire having a diameter 0.1~2.0 mm is produced.

Additionally, the extruded wire is heated to the sinter temperature of the oxide superconductor powder, so that the bonding agent is vaporized and removed by the increasing temperature and the oxide superconductor powder and the silver powder are sintered. Consequently, the multiple cylindrical superconductor wire is produced.

The silver powder composed of Ag or Ag-Au is used for the metal layer which contacts the sintered oxide superconductor powder layer, so that a high sintering temperature the metal layer does not oxidize and does not react with the oxide superconductor powder. Therefore, the the present invention does not disturb the superconductor property.

Furthermore, the present invention can provide a wire having a random diameter with one extrusion so that the wire is easily produced. The extrusion can be carried out at ordinary temperatures so that the extrusion forming is easy and the extrusion cost is low. Further, the extrusion process is so easy that long superconductor wires can be produced easily.

The superconductor wire produced in the above-mentioned process has a superior mechanical strength and a long length. Additionally the wire has the sintered silver powder layer, so that direct solder dipping with the superconductor can be carried out. Therefore, the superconductor is easily connected with metal.

Consequently, the present invention provides a superconductor having a superior mechanical strength, a long length, and a process for the easy production thereof.

EXAMPLE 1

The superconductor wire and the process of production thereof according to the present invention will now described with reference to FIG. 1~FIG. 4.

Figure 2:
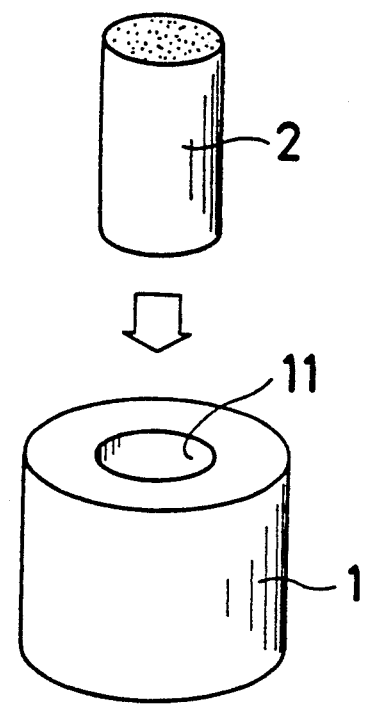
FIG. 2 shows a perspective view of the silver mixture and the superconductor mixture in Example 1.

First, as shown in FIG. 2, the silver mixture 1, comprising the silver powder mixed with the bonding agent, is formed. The silver mixture 1 is shown as the cylinder having a cavity 11.

Figure 3:
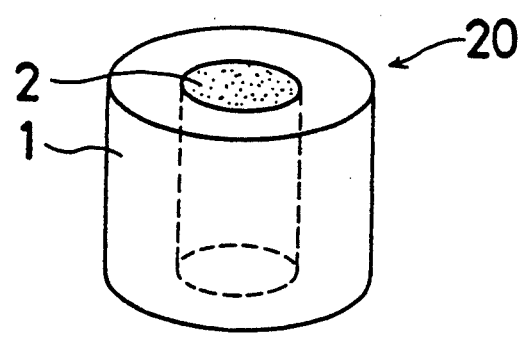
FIG. 3 shows a perspective view of the complex billet in Example 1.

Next, the superconductor mixture 2 comprising the oxide superconductor mixed with the bonding agent is formed. The mixture is the columnar body 2 having approximately the same diameter as the cavity 11. Then, as shown in FIG. 3, the superconductor mixture 2 is inserted into the cavity 11 of the silver mixture 1 to provide the composite billet 20.

Figure 1:
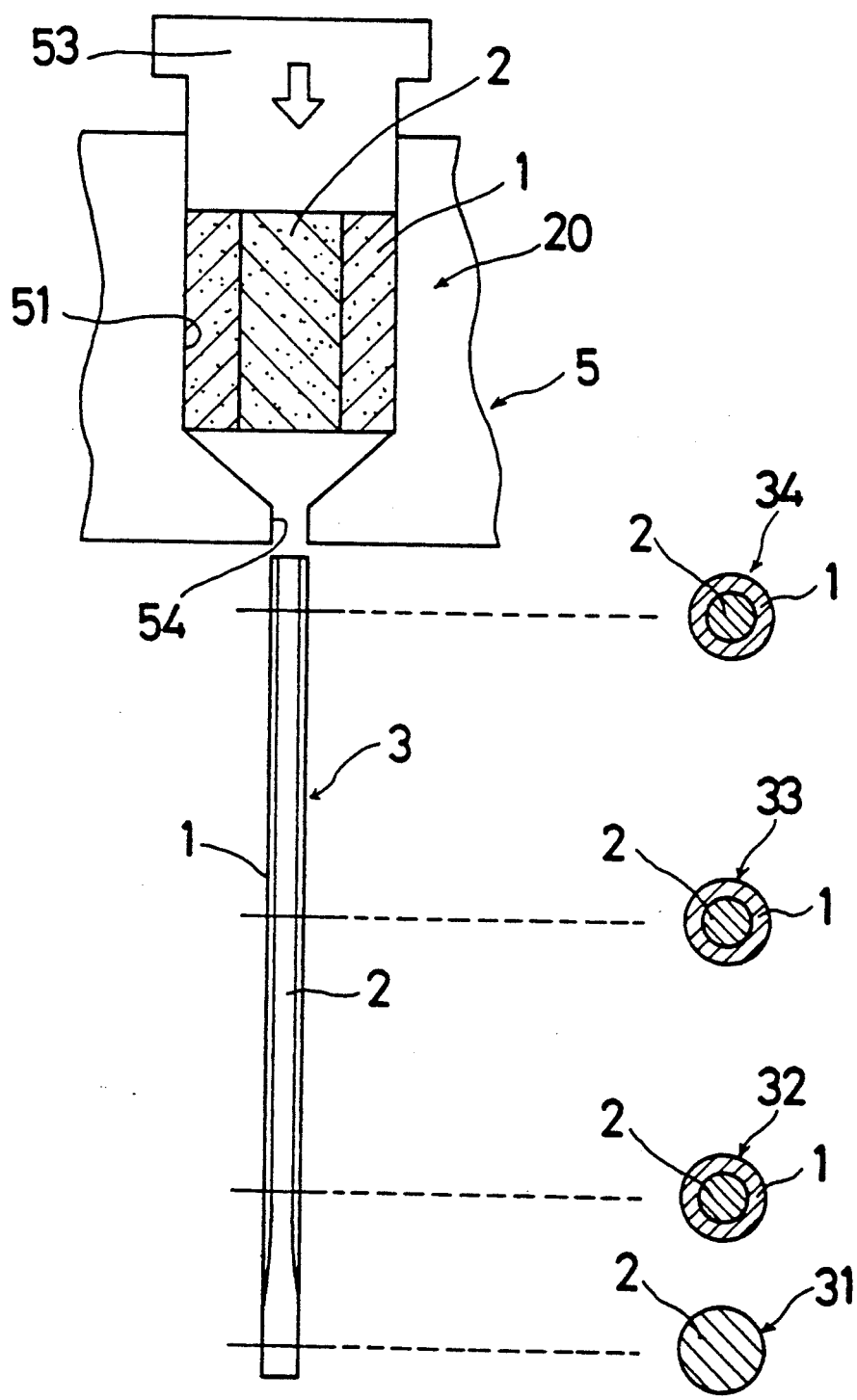
FIG. 1 shows a cross sectional view of the method of producing the wire in Example 1.

Then, in FIG. 1 the composite billet 20 is put into the cavity 51 of the extrusion die 5. The extrusion die 5 has a ram 53 and an extrusion hole 54. The ram 53 is pressured to extrude at the ordinary temperature through extrusion hole 54. As a result of this, the multiple cylindrical wire 3 with the silver mixture 1 formed around the superconductor mixture 2 is extruded.

In FIG. 1, the longitudinal cross-sectional view of wire 3 is shown as it comes out of the extrusion die 5, and the transverse cross-sectional view of the wire at selected points of the longitudinal direction of the wire 3 is shown to the right. In FIG. 1, at the beginning step of the extrusion the wire is composed of the superconductor mixture only (numeral 31), but at the advanced steps on the wire (numeral 32~34), the wire has double rings which are arranged with the superconductor mixture 2 inside and the silver mixture 1 outside.

Then, the wire 3 is heated at the sintered temperature of the oxide superconductor, and the bonding agent is vaporized and removed, and at the same time the oxide superconductor and the silver powder are sintered. Therefore, as shown as FIG. 4-A, the superconductor wire 26 having multiple rings composed of the sintered silver powder layer 14 and sintered superconductor layer 23 is produced.

In the sintering, if the sintered time is longer or the sintered temperature is higher, the sintered silver powder layer 14 penetrates the sintered oxide superconductor powder layer 23 with molecular diffusion to provide the penetration layer 141, shown in FIG. 4-B. In this case, the penetration layer 141 penetrates the sintered oxide superconductor layer 23 which is relatively brittle, and the sintered silver powder layer 14 having superior mechanical strength surrounds the penetration layer. Therefore, this superconductor has additional superior mechanical strength.

FIG. 4-C shows a superconductor in which the penetration layer 141 is at the center of the sintered oxide superconductor powder layer 23. In this case, the peripheral sintered silver powder layer 14 is thin, so that the superconductor has a slightly inferior mechanical strength to the example shown in FIG. 4-B.

EXAMPLE 2

Figure 6:
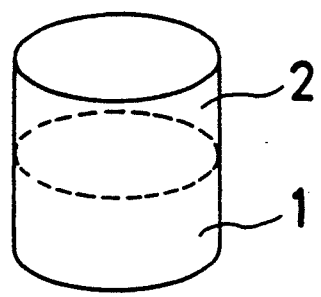
FIG. 6 shows a perspective view of the silver mixture and the superconductor mixture in Example 2.

In FIG. 5, and FIG. 6, the silver mixture 1 and the superconductor mixture 2 are columns having the same diameters.

In extrusion, as shown in FIG. 5, the silver mixture is arranged downward in the cavity of the extrusion die 5, and the superconductor is arranged upward in the cavity of the extrusion die 5. Then, the ram 53 is pressed at the ordinary temperature. As a result of this, a wire 4 having multiple rings with the silver mixture formed around the superconductor mixture 2 is produced.

In FIG. 5 the longitudinal cross-sectional view of wire 4 is shown as it comes out of the extrusion die 5, and the transverse cross-sectional view of the wire at selected points of the longitudinal direction of the wire 4 is shown at the right. In FIG. 5, at the beginning step of the extrusion the wire is composed of silver mixture 1 only (numeral 41). Then, the superconductor mixture 2 is gradually revealed in the center part (numeral 42), and finally the wire has the superconductor mixture 2 only (numeral 45).

This superconductor wire 4 is sintered and is produced the same as Example 1.

In Examples 1 and 2 the silver mixture 1 and superconductor mixture 2 are formed separately, and then are extruded. The bonding agent is mixed respectively in both mixtures. Therefore in extruding, the silver powder and oxide superconductor flow smoothly, and then the long wire having the multiple rings is produced.

The wire 3,4 is heated at the sinter temperature, and in that process the bonding agent is vaporized. The superconductor 26 comprising the sintered oxide superconductor powder layer 23 and the sintered silver powder layer 14 is produced.

The superconductor 26 has alternate neighbouring rings having the sintered layer 23, 14, so it that has a superior mechanical strength. The superconductor 26 has the silver material for the metal layer, so that the superconductor is not oxidized. The superconductor 26 does not react with the oxide superconductor powder so that the superconductor does not disturb the superconductor property.

EXAMPLE 3

The actual production of the superconductor used as Example 1 is hereby explained.

First, 85% (by weight) of Ag powder having an average particle diameter of 2 $\mu$m and 15% of viscous acrylic resin (MITSUI TOATSU CHEMICALS, INC. "BINDSELAM" is a trademark) as the bonding agent are mixed at room temperature to provide the cylindrical silver mixture 1 with an inside diameter of 10 mm, on outside diameter of 20 mm, and a height of 20 mm.

Next, 87% of $Y_1Ba_2Cu_3O_x$ (wherein x=6.5~7.0) powder having an average particle diameter of 100 $\mu$m and 13% of the above identified acrylic resin are mixed at the softening temperature of the resin to provide the superconductor mixture 2, with a diameter of 10 mm and a height of 20 mm (FIG. 2).

Then, the superconductor mixture 2 was inserted in the cavity of the silver mixture 1 to provide the complex billet, and then the complex billet was arranged in the extrusion die. Then, the complex billet was extruded at 20° C. at a surface pressure of 500~1000 kg/cm$^2$ with the extrusion hole having a diameter of 1 mm. As a result of this, a long wire 3 having multiple rings was produced (FIG. 1).

The wire 3 was then heated at 400°~500° C. and the bonding agent was removed. Then the temperature was increased, and the wire was sintered at 940° C. for 12 hours in oxygen. Then, the furnace was cooled to provide the sintered superconductor wire. The superconductor wire was gray white in color, and hard, and the diameter of the wire was 0.6 mm with shrinkage.

Observation with the SEM (Scanning Electron Microscope) of a cross section of the superconductor was carried out. As a result of this, it was observed that Ag had penetrated and diffused into the sintered area around superconductor powder layer 23 in FIG. 4-B.

Figure 7:
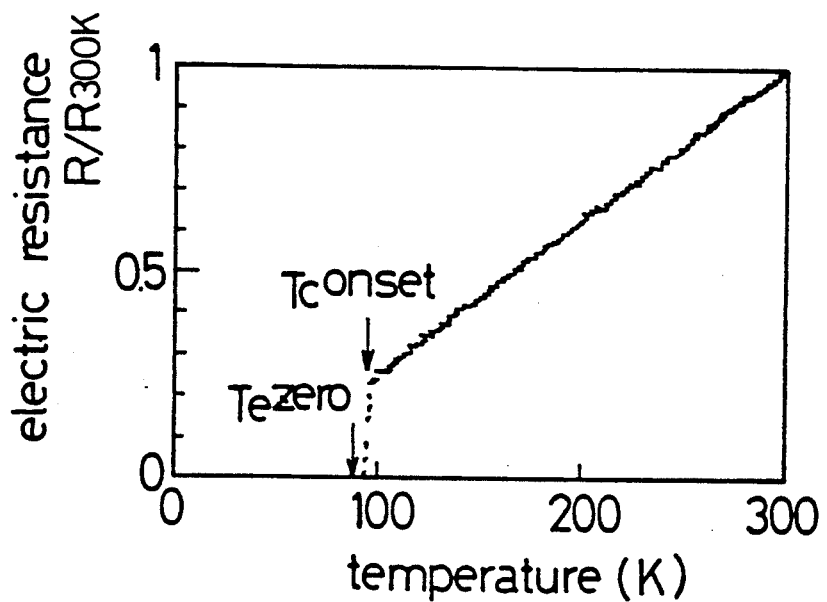
FIG. 7 shows a temperature versus elective resistance graph of the superconductor produced in Example 3.

Then, as shown in FIG. 7, the relation of the absolute temperature (K) and the electric resistance of the superconductor wire was measured.

In FIG. 7, it was recognized that the beginning point Tc (ONSET) of the superconductive transition temperature was 92K and the zero resistance point Tc (ZERO) was 88K, so that the present superconductor wire had superior superconductor property.

In addition, in order to compare the present invention, only the superconductor mixture which is composed of 85% of the $Y_1Ba_2Cu_3O_x$ powder and 15% of the acrylic resin was extruded, and then was sintered. The superconductor wire was produced. However, this superconductor was very brittle, so that it was broken by crumpling with the fingers.

EXAMPLE 4

FIG. 8 shows transverse cross sectional view of several embodiments of the superconductor wire having multiple rings.

FIG. 8 A shows the superconductor wire in Example 1. FIG. 8 B shows the superconductor wire having the sintered silver powder layer 14 in the center and the periphery, and having the sintered oxide superconductor powder layer 23 between them. FIG. 8 C shows the superconductor wire four layers with having the sintered superconductor powder oxide powder layer 23 in the center and the second layer, and having the sintered silver powder layer 14 between them and forming the periphery.

FIGS. 8D-F show superconductor wire having the sintered oxide superconductor powder layer 23 and the sintered silver powder layer 14 which are arranged in the reverse of those in FIG. 8 A-C.

What is claimed is:

1. A process for production of superconductor wire having multiple rings, comprising the steps of:
    preparing a silver mixture comprising a silver powder or silver-gold alloy powder mixed with an organic bonding agent, and superconductor mixture comprising a superconductor powder with an organic bonding agent;
    arranging both the silver mixture and the superconductor mixture in an extrusion die;
    extruding a wire having a core selected from either the superconductor mixture or the silver mixture such that when said wire has the superconductor mixture core said wire has at least one radial ring of said silver mixture and when said wire has the silver mixture core said wire has at least one radial ring of said superconductor mixture;
    heating said wire at a temperature sufficient to sinter said superconductor mixture and said silver mixture such that the bonding agent is removed from said wire.

2. A process for production of superconductor the wire according to claim 1, wherein said oxide superconductor powder is $Y_1Ba_2Cu_3O_x$ ($x=6.5\sim7.0$).

3. A process for production of superconductor wire according to claim 1, wherein the shape of the silver mixture is cylindrical and the shape of the superconductor mixture is a column, and both mixtures are arranged so that the columnar superconductor mixture is placed inside the cylindrical silver mixture in the extrusion die, and both mixtures are extruded along a common axis thereof.

* * * * *